United States Patent
Chiba et al.

(10) Patent No.: US 7,957,549 B2
(45) Date of Patent: Jun. 7, 2011

(54) ACOUSTIC APPARATUS AND METHOD OF CONTROLLING AN ACOUSTIC APPARATUS

(75) Inventors: Norikatsu Chiba, Kawasaki (JP); Toshifumi Yamamoto, Sagamihara (JP); Takashi Fukuda, Ome (JP); Yasuhiro Kanishima, Ome (JP); Shigeyasu Iwata, Hamura (JP); Kazuyuki Saito, Hamura (JP); Yutaka Oki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/634,424

(22) Filed: Dec. 9, 2009

(65) Prior Publication Data

US 2010/0142719 A1 Jun. 10, 2010

(30) Foreign Application Priority Data

Dec. 9, 2008 (JP) ................................ 2008-313584

(51) Int. Cl.
*H04R 25/00* (2006.01)
*H02B 1/00* (2006.01)
(52) U.S. Cl. ...................... 381/328; 381/163; 381/123
(58) Field of Classification Search .............. 381/71.6, 381/26, 309, 328, 72, 74, 163, 380, 384, 381/123, 60, 312; 181/129, 130, 135; 600/559, 600/25

See application file for complete search history.

(56) References Cited

U.S. PATENT DOCUMENTS

| | | | | |
|---|---|---|---|---|
| 5,792,073 A | * | 8/1998 | Keefe | 600/559 |
| 6,048,320 A | * | 4/2000 | Brainard, II | 600/559 |
| 6,731,768 B1 | * | 5/2004 | Delage | 381/312 |
| 7,529,379 B2 | * | 5/2009 | Zurek et al. | 381/328 |
| 2006/0093159 A1 | * | 5/2006 | Koh et al. | 381/98 |

FOREIGN PATENT DOCUMENTS

| | | |
|---|---|---|
| JP | 4-171497 | 6/1992 |
| JP | 7-115700 | 5/1995 |
| JP | 9-187093 A | 7/1997 |
| JP | 10-126896 A | 5/1998 |
| JP | 2000-069596 A | 3/2000 |
| JP | 2000-354284 A | 12/2000 |
| JP | 2004-128854 A | 4/2004 |
| JP | 2007-235724 | 9/2007 |
| JP | 2008-177798 A | 7/2008 |

OTHER PUBLICATIONS

Japanese Office Action dated Mar. 16, 2010, Japanese Patent Application No. 2008-313584.
Japanese Final Office Action dated Jun. 8, 2010, Japanese Patent Application No. 2008-313584.

* cited by examiner

*Primary Examiner* — Xu Mei
(74) *Attorney, Agent, or Firm* — Patterson & Sheridan, LLP

(57) ABSTRACT

According to one embodiment, an acoustic apparatus comprises an electro-acoustic transducer with a first function of converting an electric signal to an acoustic signal and a second function of converting an acoustic signal to an electric signal, the electro-acoustic transducer configured to convert a measuring electric signal to a measuring acoustic signal using the first function, and to convert an acoustic response signal responding to the measuring acoustic signal from an object to an electric response signal using the second function, a switch configured to switch the first function to the second function, or vice versa, and a switch controller configured to control a function switching of the switch in accordance with a sound source signal.

9 Claims, 6 Drawing Sheets

US 7,957,549 B2

ACOUSTIC APPARATUS AND METHOD OF CONTROLLING AN ACOUSTIC APPARATUS

CROSS-REFERENCE TO RELATED APPLICATIONS

This application is based upon and claims the benefit of priority from Japanese Patent Application No. 2008-313584, filed Dec. 9, 2008, the entire contents of which are incorporated herein by reference.

BACKGROUND

1. Field

One embodiment of the invention relates to an acoustic apparatus and a method of controlling an acoustic apparatus.

2. Description of the Related Art

While listening to music through an earphone or a headphone (hereinafter, generally called "earphone"), a person may hear unnatural sound when the ear canal is plugged with the earphone, causing resonance between the eardrums and the earphone. It is therefore desired to measure the resonance characteristics of the ear canal and to correct the resonance characteristics before a sound-source signal is supplied to the earphone.

The shapes and acoustic transmission characteristic of ear canal, and the physical properties and acoustic transmission characteristic of eardrums differ from person to person. Further, the resonance in either ear canal changes in accordance with the type of the earphone and the state in which the earphone is held in the ear canal. Hence, the resonance characteristics of the ear canal of each listener must be corrected in order to achieve accurate correction of the resonance in the ear canal.

Jpn. Pat. Appln. KOKAI Publication No. 9-187093 discloses an acoustic playback apparatus (see paragraphs [0034], [0035] and [0036]). In this apparatus, a headphone having a unit composed of a speaker and a microphone generates and collects an audio signal sound, and the resonance frequency of the user's ear is measured. Based on the resonance frequency measured, the output level of the component of the audio signal that has the resonance frequency is lowered to a predetermined level.

The acoustic playback apparatus disclosed in the above-identified publication necessitates use of a headphone (earphone) having a unit composed of a speaker and a microphone. Inevitably, the headphone may be not only large, but also complex in structure. Further, the manufacturing cost of the headphone is high because the earphone includes a microphone. Still further, the timing of acquiring a response signal to the audio signal sound generated must be more accurately controlled than otherwise.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an acoustic apparatus comprises an electro-acoustic transducer configured to be held to an object and having a first function of converting an electric signal to an acoustic signal and a second function of converting an acoustic signal to an electric signal, the electro-acoustic transducer configured to convert a measuring electric signal to a measuring acoustic signal using the first function, and to convert an acoustic response signal responding to the measuring acoustic signal from the object to an electric response signal using the second function; a switch configured to switch the first function to the second function, or vice versa; and a switch controller configured to control a function switching of the switch in accordance with a sound source signal of at least one of channels which are input to the switch.

Figure 1:
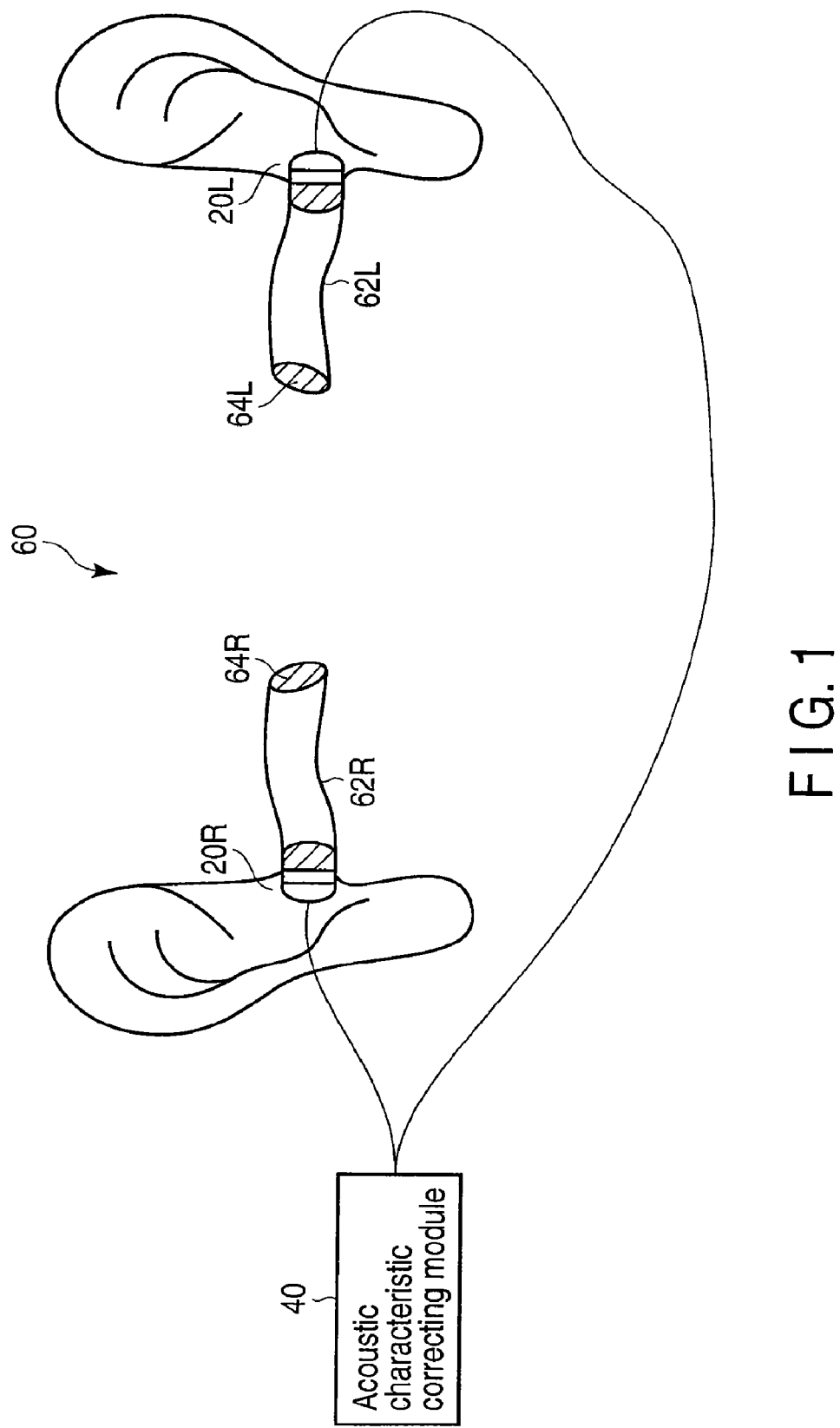
FIG. 1 is an exemplary diagram showing the concept of measuring and correcting acoustic transmission characteristics in an embodiment of the present invention.

FIG. 1 is a diagram showing the concept of measuring and correcting acoustic transmission characteristics in an acoustic apparatus that is an embodiment of the present invention. Resonance characteristics of the ear canal are measured and corrected, as acoustic transmission characteristics, as will be explained below. An earphone 20R closes one end of the ear canal 62R of the right ear of a listener 60. An earphone 20L closes one end of the ear canal 62L of the left ear of the listener 60. The listener 60 has an eardrum 64R in the other end of the ear canal 62R of the right ear, and has an eardrum 64L in the other end of the ear canal 62L of the left ear. Headphones may be used in place of the earphones. Hereinafter, devices that have the function of converting acoustic signals to electric signals, such as earphone and headphone, will be generically called "earphones."

The ear canal 62R is closed with the earphone 20R, and the ear canal 62L is closed with the earphone 20L. The acoustic signals supplied from the earphones 20L and 20R travel through the ear canals 62L and 62R, respectively, reaching the ear drums 64L and 64R, respectively. At this point, a phenomenon occurs, which is known as resonance.

The acoustic characteristic correcting module 40 is arranged outside the ear canals 62L and 62R and is electrically connected to the earphones 20L and 20R. The acoustic characteristic correcting module 40 detects frequency characteristics of the left and right ears of the listener 60 and corrects the frequency characteristics of sound source signals that should be supplied to the listener 60 (in order to lower the gain of resonance frequencies). The characteristics of the left and right ear canals 62L and 62R are different from each other. Accordingly, the left and right earphones 20L and 20R are connected to the acoustic characteristic correcting module 40 so that the resonance characteristics of the left and right ear canals are corrected.

The acoustic characteristics correcting module 40 may be connected to, or incorporated in, an external apparatus that has an audio playback function, such as a personal computer (PC), a music player and an optical-disk player.

Figure 2:
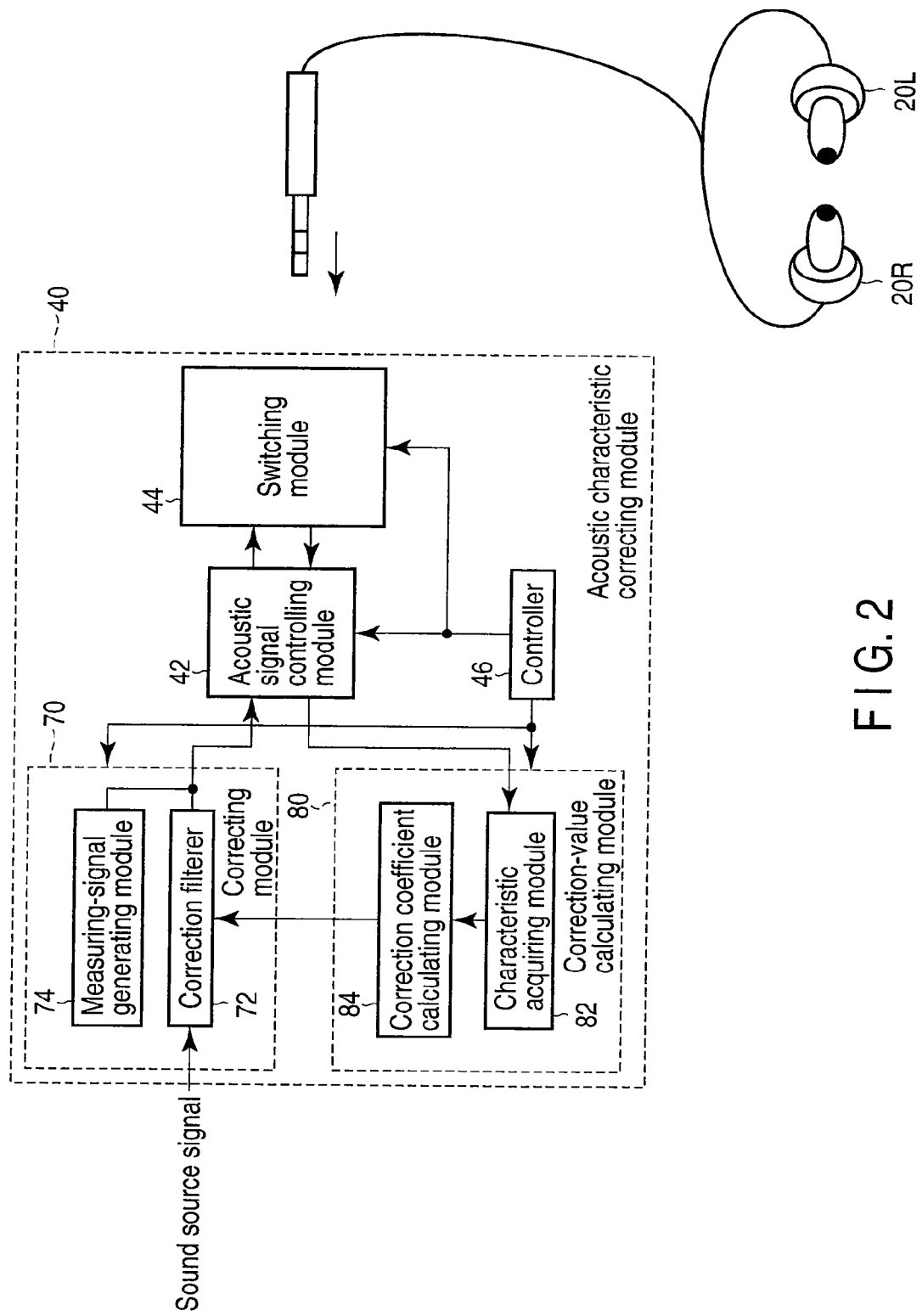
FIG. 2 is an exemplary diagram showing an exemplary configuration of an acoustic characteristic correcting module 40 according to the embodiment of this invention.

FIG. 2 is a diagram that shows an exemplary configuration of the acoustic characteristic correcting module 40 according to the embodiment of the present invention. The acoustic characteristic correcting module 40 includes a correcting module 70, a correction-value calculating module 80, an acoustic signal controlling module 42, a controller 46, and a switching module 44.

The controller 46 has a memory or can access to an external memory. Executing the programs stored in the memory, the controller 46 controls the other components of the acoustic characteristic correcting module 40. To measure the characteristics of the ear canals 62L and 62R of the listener 60, the controller 46 sets the acoustic-signal controlling module 42 and the switching module 44 to a measurement mode. If the resonance characteristics of the ear canals 62L and 62R are acquired in the measurement mode, the acoustic-signal controlling module 42 and the switching module 44 are set to a correction mode.

As shown in FIG. 2, the controller 46 is provided in the acoustic characteristic correcting module 40. Nonetheless, the controller 46 may be provided outside the acoustic characteristic correcting module 40. If the acoustic characteristic correcting module 40 is connected to, for example, an external apparatus, the controller 46 may be provided in the external apparatus. In this case, the processor incorporated in the external apparatus may execute the programs stored in the memory the external apparatus has, to control the acoustic characteristic correcting module 40. Alternatively, the processor incorporated in the external apparatus may control the operation of the controller 46 in the acoustic characteristic correcting module 40.

The correcting module 70 receives a sound source signal that the listener 60 may hear. The correcting module 70 comprises a correction filter 72 and a measuring-signal generating module 74. The measuring-signal generating module 74 generates measuring signals that are used to measure the resonance characteristics (resonance frequencies) of the ear canal. The measuring signals are, for example a unit pulse or time stretched pulses (TSP) having a width falling within a predetermined range. The correction filter 72 corrects the sound source signal on the basis of the resonance characteristics measured of the ear canals 62L and 62R. While the module 40 remains in measurement mode, the measuring-signal generating module 74 generates a measuring signal, which is supplied, as sound source signal, to the acoustic-signal controlling module 42. While the module 40 remains in correction mode, the sound source signal input to the correcting module 70 is corrected by the correction filter 72. The sound source signal, thus corrected, is output to the acoustic-signal controlling module 42. The sound source signal output as an electric signal from the correcting module 70 has a plurality of channels, including a left channel and a right channel, which are input to the earphones 20L and 20R, respectively. These channels are synchronized in the sound source signal.

The earphones 20L and 20R are electrically connected to the switching module 44. The sound source signal output from the acoustic-signal controlling module 42 is output via the switching module 44 to the earphones 20L and 20R. The earphones 20L and 20R convert the sound source signal, i.e., electric signal, to an acoustic signal. The acoustic signal is applied to the ear canals 62L and 62L of the listener 60. Hence, as long as the module 40 remains in the measurement mode, the measuring signal generated by the measuring-signal generating module 74 is supplied to the earphone 20L or the earphone 20R through the switching module 44.

In the measurement mode, the measuring signal, i.e., acoustic signal applied to the earphones 20L and 20R, is reflected by the eardrums 64L and 64R. The acoustic signals reflected by the eardrums 64L and 64R, respectively, are converted by the earphones 20L and 20R to electric signals (response signals). Each of the response signals is input to the acoustic-signal controlling module 42 through the switching module 44. That is, the earphones 20L and 20R perform a microphone function, each converting an acoustic signal to an electric signal.

The correction-value calculating module 80 receives the response signal via the acoustic-signal controlling module 42. The correction-value calculating module 80 includes a characteristic acquiring module 82 and a correction coefficient calculating module 84. The characteristic acquiring module 82 acquires the resonance characteristic (resonance frequency) of the ear canals 62L or 62R from the response signal received. The correction coefficient calculating module 84 calculates the correction coefficient of the correction filter 72 from the resonance characteristic the characteristic acquiring module 82 has acquired. Once the correction coefficient thus calculated has been set to the correction filter 72, the sound source signal is corrected in the correction mode, on the basis of the acoustic characteristics of the listener 60. The sound source signal thus corrected is output to the earphones 20L and 20R through the acoustic-signal controlling module 42 and switching module 44.

As described above, the earphones 20L and 20R function not only as earphones, but also as microphones, in the measurement mode. That is, they perform the earphone function, applying the measuring signal to the ear canal (first state), and perform the microphone function, acquiring the waves reflected from the ear canal (second state). The timing of switching the earphone function to the microphone function, or vice versa, must be accurate enough, and performed fast enough, to detect the reflected waves well.

It is difficult for the software process performed by the controller 46 to accurately control the timing of switching the function. Outputting of signals exactly at a desired timing cannot be ensured, particularly in any apparatus that performs a complex process such as multithread.

Figure 3:
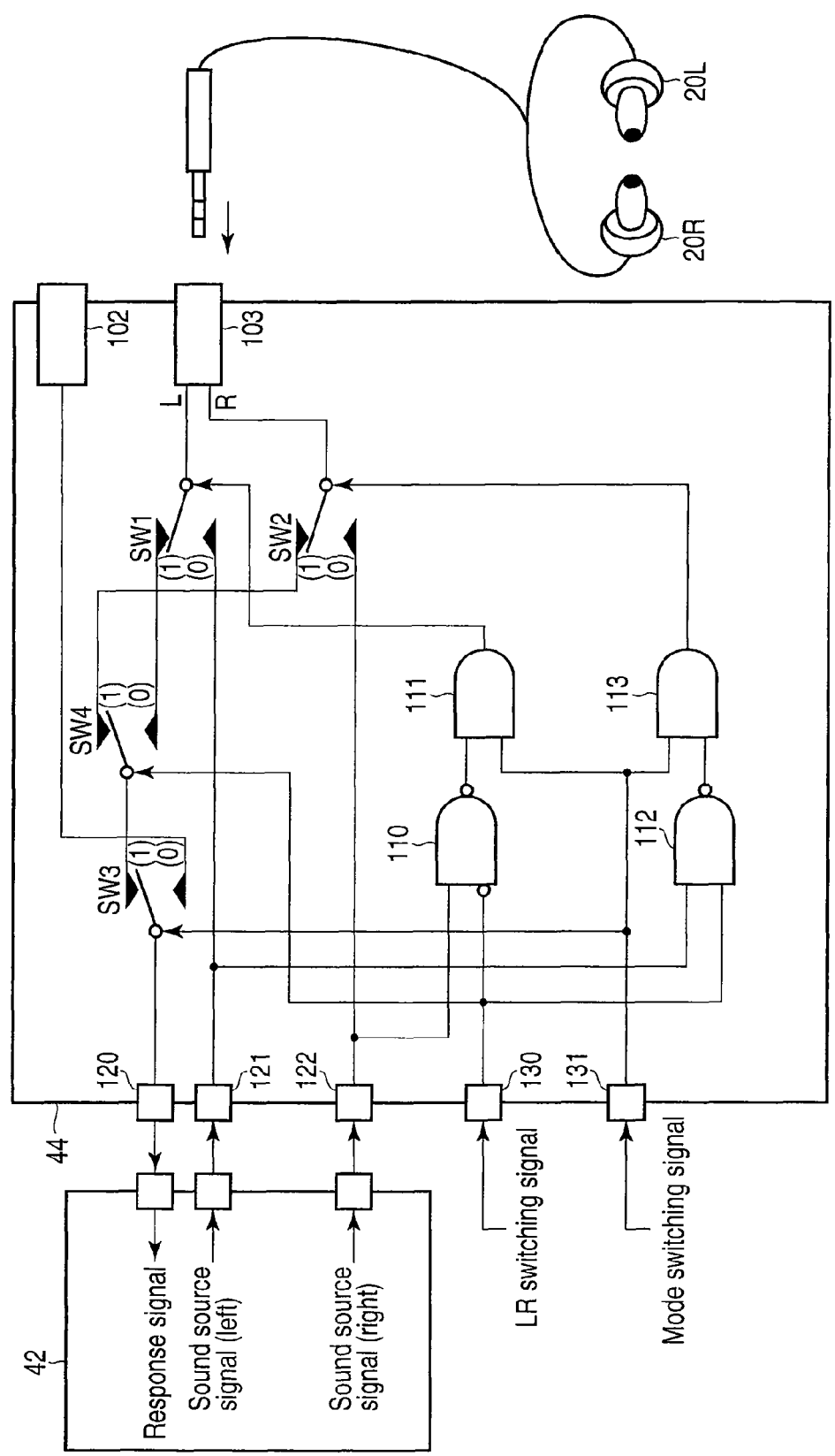
FIG. 3 is an exemplary diagram showing an exemplary configuration of the switching module 44 in the acoustic characteristic correcting module 40 according to the embodiment of the invention.

In the present embodiment, at least one channel of the sound source signal is used to switch the function from the earphone function (first sate) to the microphone function (second state), or vice versa. FIG. 3 is a diagram showing an exemplary configuration the switching module 44 may have in the present embodiment.

The switching module 44 has an input/output terminal 131, to which a mode switching signal is supplied from the controller 46. If the mode switching signal is at a high level (=1), the switching module 44 is set to the measurement mode. On the other hand, if the mode switching signal is at a low level (=0), the switching module 44 is set to the correction mode.

The switching module 44 has an input/output terminal 130, to which an LR switching signal is supplied from the controller 46. If the LR switching signal is at a low level (=0), the resonance characteristic of the left ear canal 62L of the listener 60 is measured. On the other hand, if the LR switching signal is at a high level (=1), the resonance characteristic of the right ear canal 62R of the listener 60 is measured.

The switching module 44 has input/output terminals 121 and 122, too. To these input/output terminals 121 and 122, sound source signals output from the correcting module 70 are input through the acoustic-signal controlling module 42. More precisely, the left-channel sound source signal is input to the left-channel input/output terminal 121, and the right-channel sound source signal is input to the right-channel input/output terminal 122. In the measurement mode, the measuring signal output from the measuring-signal generating module 74 is input to one of the input/output terminals 121 and 122, and a control signal for switching the first state to the second state, or vice versa, is input to the other of the input/output terminals 121 and 122. The signal that should be output from the controlling module 42 to the switching module 44 is at such a level that the NAND circuits 110 and 112, both in the switching module 44, may recognize it as "1".

The switching module 44 has another input/output terminal 120. This input/output terminal 120 is connected to the acoustic-signal controlling module 42, which in turn is connected to the correction-value calculating module 80. The measuring signal (response signal) reflected by the eardrum 64L or 64R of the listener 60 is supplied from the input/output terminal 120 to the correction-value calculating module 80.

The switching module 44 has an earphone terminal 103, which electrically connects the earphones 20L and 20R to the switching module 44. The left-channel sound source signal and the right-channel sound source signal are output via the earphone terminal 103 to the left-channel earphone 20L and the right-channel earphone 20R, respectively. The response signal is input to the switching module 44 through the earphone terminal 103.

The switching module 44 has switches SW1 to SW4 and logic circuits 110 to 113. The switches SW1 to SW4 are changed over when the outputs of the logic circuits 110 to 113 change in accordance with the levels of the mode switching signal and LR switching signal. As the switches SW1 to SW4 are so changed over, one of the input/output terminals 120, 121 and 122 is connected to the earphone terminal 103. The switches SW1 and SW2 are provided to change the earphone function (first state) to the microphone function (second state), or vice versa. More precisely, the switch SW1 switches the function of the left-channel earphone 20L, and the switch SW2 switches the function of the right-channel earphone 20R. The switch SW3 connects the earphone terminal 103 or the microphone terminal 102 to the input/output terminal 120. The switch SW4 connects the right channel or the left channel to the input/output terminal 120.

The signal input to the input/output terminal 130 is inverted and input to the NAND circuit 110. The signal input to the input/output terminal 122 is input to the NAND circuit 110, too. The signal output from the NAND circuit 110 and the signal input to the input/output terminal 131 are input to the AND circuit 111. The signal output from the AND circuit 111 is supplied to the switch SW1. The switch SW1 is changed over to the (0) side or the (1) side in accordance with the level (0 or 1) of the signal output from the AND circuit 111.

The signal input to the input/output terminal 130 and the signal input to the input/output terminal 121 are input to the NAND circuit 112. The signal output from the NAND circuit 112 and the signal input to the input/output terminal 131 are input to the AND circuit 113. The signal output from the AND circuit 113 is supplied to the switch SW2. The switch SW2 is changed over to the (0) side or the (1) side, in accordance with the level (0 or 1) of the signal output from the AND circuit 113.

The switch SW3 is changed over to the (0) side or the (1) side, in accordance with the level (0 or 1) of the mode switching signal supplied from the input/output terminal 131. The switch SW4 is changed over to the (0) side or the (1) side, in accordance with the level (0 or 1) of the mode switching signal supplied from the input/output terminal 130.

If the signal supplied from the AND circuit 111 is 0, the switch SW1 is changed over to the (0) side, connecting the input/output terminal 121 to the left channel of the earphone terminal 103. The left channel of the switching module 44 is therefore set to the first state, whereby the earphone 20L performs the earphone function.

If the AND circuit 113 outputs 0, the switch SW2 is changed over to the (0) side, connecting the input terminal 122 to the left channel of the earphone terminal 103. The right channel of the switching module 44 is therefore set to the first state, whereby the earphone 20R performs the earphone function.

On the other hand, if the switch SW1, the switch SW4 and the switch SW3 are changed over to the (1) side, the (0) side and the (1) side, respectively, the input/output terminal 120 is connected to the left channel of the earphone terminal 103. In this case, the left channel is set to the second state, and the earphone 20L functions as a microphone.

If the switch SW2, the switch SW4 and the switch SW3 are changed over to the (1) state, the input/output terminal 120 is connected to the right channel of the earphone terminal 103. In this case, the right channel is set to the second state and the earphone 20R functions as a microphone.

If the mode switching signal supplied from the input/output terminal 131 to the switch SW3 is 0 (at a low level, designating the correction mode), the switch SW3 is changed over to the (0) side. The microphone terminal 102 is therefore connected to the input/output terminal 120, and the acoustic signal from a microphone (not shown) is input to the acoustic-signal controlling module 42. Thus, the input/output terminal 120 is connected to a measurement-related circuit in the measurement mode only. This can prevent any negative influence on the measurement-related circuit while the module 40 remains in a non-measurement mode.

Figure 4:
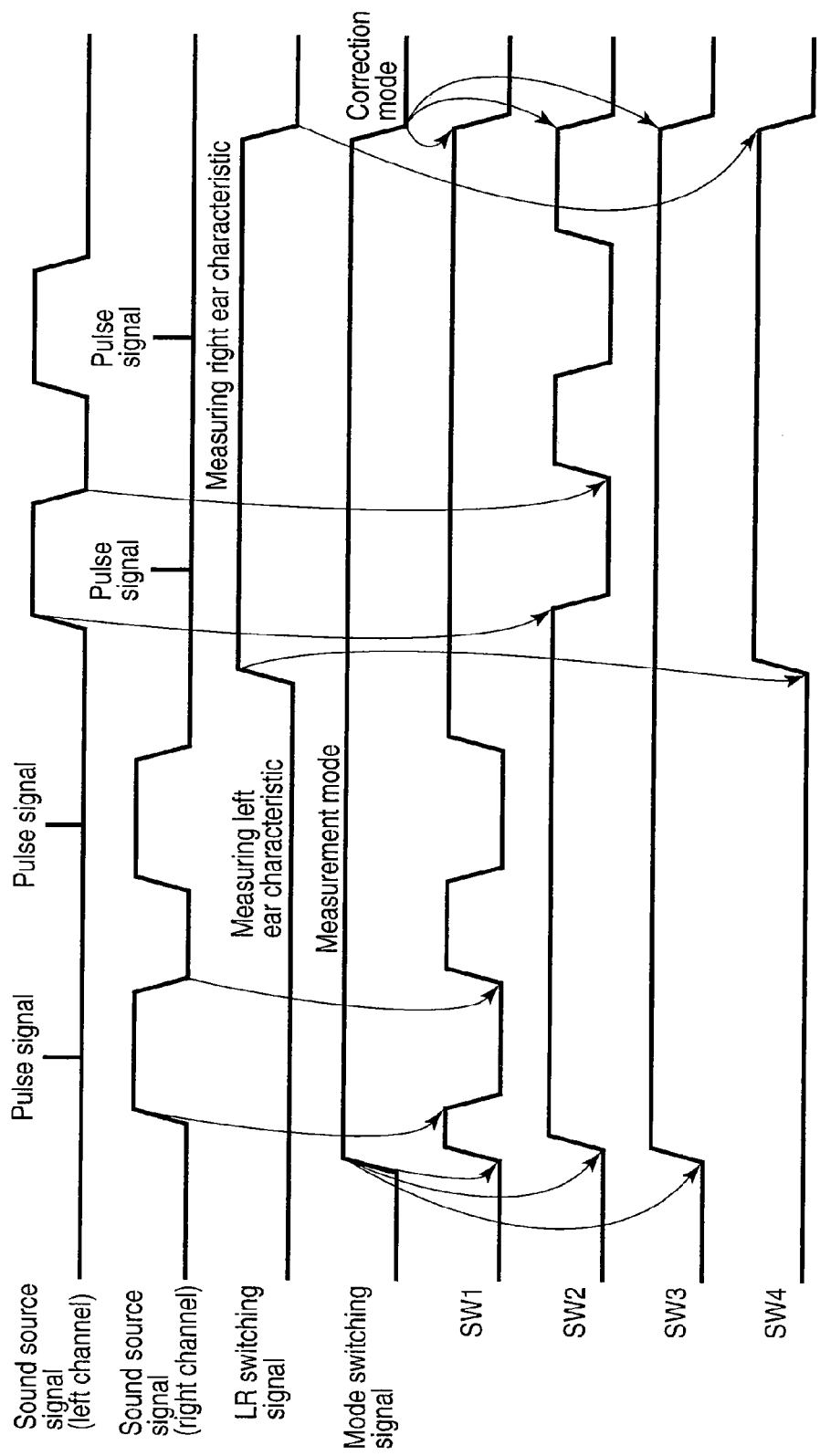
FIG. 4 is an exemplary timing chart explaining how to measure resonance characteristics.

FIG. 4 is an exemplary timing chart explaining how the acoustic transmission characteristic is measured.

If the switching signal supplied from the controller 46 has a value of 1, the switching module 44 is set to the measurement mode. Therefore, 1 is output from the input/output terminal 131 to the AND circuits 111 and 113. As a result, the output of the AND circuit 111 changes in accordance with the signal supplied from the NAND circuit 110, and the output of the AND circuit 113 changes in accordance with the signal supplied from the NAND circuit 112. From the input/output terminal 131, 1 is output to the switch SW3. The switch SW3 is changed over to the (1) side.

Based on the value of the LR switching signal supplied from the controller 46, it is determined whether the resonance characteristic of the left ear or that of the right ear should be measured. As shown in FIG. 4, the resonance characteristic of the left ear will be measured if the LR switching signal has a value of 0. In this case, the input/output terminal 130 outputs 0 to the switch SW4. The switch SW4 is therefore changed over to the (0) side.

The signal coming from the input/output terminal 130 is inverted and input to the NAND circuit 110. Hence, 1 is input to the NAND circuit 110 if the LR switching signal is 0 (to measure the characteristic of the left ear). The output of the NAND circuit 110 therefore changes in accordance with the sound source signal of the right channel, which has been input via the input/output terminal 122. If the NAND circuit 110 detects the output signal from the input/output terminal 122 as a signal having a value of 1, the signal output from the NAND circuit 110 to the AND circuit 111 is 0. Therefore, the output signal of the AND circuit 111 is therefore 0, and the switch SW1 is changed over to the (0) side. The switch SW1 therefore connects the left channel of the earphone terminal 103 to the input/output terminal 121. That is, the left channel is set to the first state. The earphone 20L can therefore perform the earphone function.

Now that 0 is input from the input/output terminal 130 to the NAND circuit 112, the NAND circuit 112 outputs 1 to the AND circuit 113. The output signal of the AND circuit 113 therefore changes to 1. The switch SW2 is thereby changed over to the (1) side. The right channel of the earphone terminal 103 is not connected to the input/output terminal 122. As a result, the earphone 20R comes into a no signal state. Thus, the output signal coming from the input/output terminal 122 is prevented from being output, as a large-volume acoustic signal, to the right-channel earphone 20R.

As described above, the left channel is set to the first state, causing the earphone 20L to function as an earphone. Then, the measuring signal generated by the measuring-signal generating module 74 is input to the input/output terminal 121. The measuring signal is output via the switch SW1 to the left channel of the earphone terminal 103. From the earphone terminal 103, the measuring signal is supplied to the earphone 20L and converted to an acoustic signal. The acoustic signal is applied to the left ear canal 62L of the listener.

As shown in FIG. 4, the measuring-signal generating module 74 generates a right-channel sound source signal at such a level that the NAND circuit 110 may detect it as 0, after applying the short-pulse of the left channel. The right-channel sound source signal, thus generated, is input via the acoustic signal controlling module 42 to the input/output terminal 122. The signal output from the NAND circuit 110 to the AND circuit 111 therefore changes to 1. As a result, the AND circuit 111 outputs 1 to the switch SW1. The switch SW1 is thereby changed over to the (1) side, whereby the left channel of the earphone terminal 103 is connected to the input/output terminal 120 by the switches SW1, SW4 and SW3. Thus, the left channel is set to the second state, causing the earphone 20L to function as a microphone. The earphone 20L converts the response signal reflected from the eardrum 64L into an electric signal. The electric signal is sent to the correction-value calculating module 80. The correction-value calculating module 80 detects the resonance characteristic of the left ear on the basis of the response signal.

The timing of switching the first state (i.e., earphone function) to the second state (i.e., microphone function) must be correctly controlled in order to receive the response signal. In this embodiment, the level of the right channel signal input to the input/output terminal 122 is changed from 1 to 0, thereby performing switching between the first state and the second state. That is, the left channel signal is used as a measuring signal for measuring the resonance characteristic of the left ear, whereas the right channel signal is used as a control signal for accomplishing the switching between the first state and the second state. The timing control can be performed with high accuracy because the electric signal output from the correcting module 70 is synchronized with respect to the left and right channels.

As seen from the timing chart of FIG. 4, the level of the right channel signal input via the input/output terminal 122 is changed back to 1, thereby acquiring again the resonance characteristic of the left ear. Nonetheless, the resonance characteristic may be acquired only once. Alternatively, the resonance characteristic may be acquired three times or more for achieving higher accuracy.

As shown in FIG. 4, the characteristic of the right ear is measured after the characteristic of the left ear has been measured. Therefore, the value of the LR switching signal supplied from the control unit changes to 1 in order to measure the resonance characteristic of the right ear. At this point, 1 is input from the input/output terminal 130 to the switch SW4. The switch SW4 is therefore changed over to the (1) side.

If the value of the LR switching signal is 1 (to measure the characteristic of the right ear), 1 is input from the input/output terminal 130 to the NAND circuit 112. The output of the NAND circuit 112 changes in accordance with the left-channel sound source signal input via the input/output terminal 121. If the NAND circuit 112 detects the signal output from the input/output terminal 121 as having the value of 1, the signal output from the NAND circuit 112 to the AND circuit 113 is 0. As a result, the output signal of the AND circuit 113 is 0. The switch SW2 is therefore changed over to the (0) side. The right channel of the earphone terminal 103 is connected by the switch SW2 to the input/output terminal 122. That is, the right channel is set to the first state, and the earphone 20R performs the earphone function.

Since the signal coming from the input/output terminal 130 is first inverted and then input to the NAND circuit 110, 0 is input to the NAND circuit 110 if the value of the LR switching signal is 1. Hence, the output signal of the AND circuit 111 becomes 1. The switch SW1 is therefore changed over to the (1) side, and the left channel of the earphone terminal 103 is not connected to the input/output terminal 121. As a result, the earphone 20L comes into a no signal state.

If the right channel is set to the first state, whereby the earphone 20R performs the earphone function, the measuring signal generated by the measuring-signal generating module 74 is input to the input/output terminal 122 and output via the switch SW2 to the right channel of the earphone terminal 103. The measuring signal is supplied from the earphone terminal 103 to the earphone 20R. The earphone 20R converts the measuring signal to an acoustic signal. The acoustic signal is applied to the right ear canal 62R of the listener 60.

As shown in FIG. 4, the measuring-signal generating module 74 generates a left-channel sound source signal of such a level that the NAND circuit 112 can detect it as 0, after the short-pulse signal for the right channel has been applied. The left-channel sound source signal, thus generated, is input via the acoustic signal controlling module 42 to the input/output terminal 121. Then, the signal output from the NAND circuit 112 to the AND circuit 113 becomes 1, and the AND circuit 113 outputs 1 to the switch SW2. The switch SW2 is thereby changed over to the (1) side. The right channel of the earphone terminal 103 is therefore connected, by the switches SW2, SW4 and SW3 to the input/output terminal 120. That is, the right channel is set to the second state, and the earphone 20R starts functioning as a microphone. The earphone 20R converts the response signal reflected by the eardrum 64R to an electric signal. The electric signal is input from the earphone terminal 103 via the switches SW2, SW4 and SW3 to the acoustic signal controlling module 42. The response signal input to the acoustic signal controlling module 42 is supplied to the correction-value calculating module 80. The correction-value calculating module 80 detects the resonance characteristic of the right ear on the basis of the response signal.

As described above, in the present embodiment, the level of the left-channel sound source signal, which is input to the input/output terminal 121, is switched from 1 to 0, thereby switching the state, from the first state to the second state, or vice versa, in order to measure the resonance characteristic of the right ear. Thus, the right-channel signal is used as a measuring signal for measuring the resonance characteristic of the right ear, and the left-channel signal is used as a control signal for switching the state, from the first state to the second state, or vice versa.

As shown in the timing chart of FIG. 4, the level of the left-channel signal to input via the input/output terminal 121 is changed to 1 again, thereby acquiring the resonance characteristic of the right ear once again. Nonetheless, the resonance characteristic may be acquired only once. Alternatively, the resonance characteristic may be acquired three times or more for achieving higher accuracy.

After the resonance characteristics of both ears have been acquired, the value of the mode switching signal is set to 0. The measuring is thereby terminated. When 0 is input to the input/output terminal 131, the acoustic signal controlling module 42 and the switching module 44 are set to the correction mode. Since the AND circuits 111 and 113 output 0, both the switch SW1 and the switch SW2 are changed over to the (0) side. As a result, the input/output terminal 121 to which the left-channel sound source signal is input is connected by the switch SW1 to the left channel of the earphone terminal 103, whereas the input/output terminal 122 to which the right-channel sound source is input is connected by the switch SW2 to the right channel of the earphone terminal 103. That is, both the left channel and the right channel are set to the first state, and the earphones 20R and 20L perform the earphone function. The switch SW3 is changed over to the (0) side, connecting the microphone terminal 102 to the output terminal 120.

In the case shown in the timing chart of FIG. 4, the resonance characteristic of the left ear is first measured twice, and the resonance characteristic of the right ear is then measured twice. Nevertheless, it does not matter which ear, the left or the right, is first subjected to the resonance characteristic measurement. Further, the resonance characteristic of the left ear and that of the right ear may be measured independently of each other.

If the earphone is used as a microphone, its sensitivity to sound is low. Inevitably, the response signal may have so low a level that noise is mixed in some cases. To measure the resonance characteristics of the ears, the first state and the second state may be switched to one the other several times, to acquire the resonance characteristics several times. In this case, the average value of the resultant response signals is obtained, successfully measuring accurate resonance characteristics of either ear, free of the influence of noise.

Figure 5:
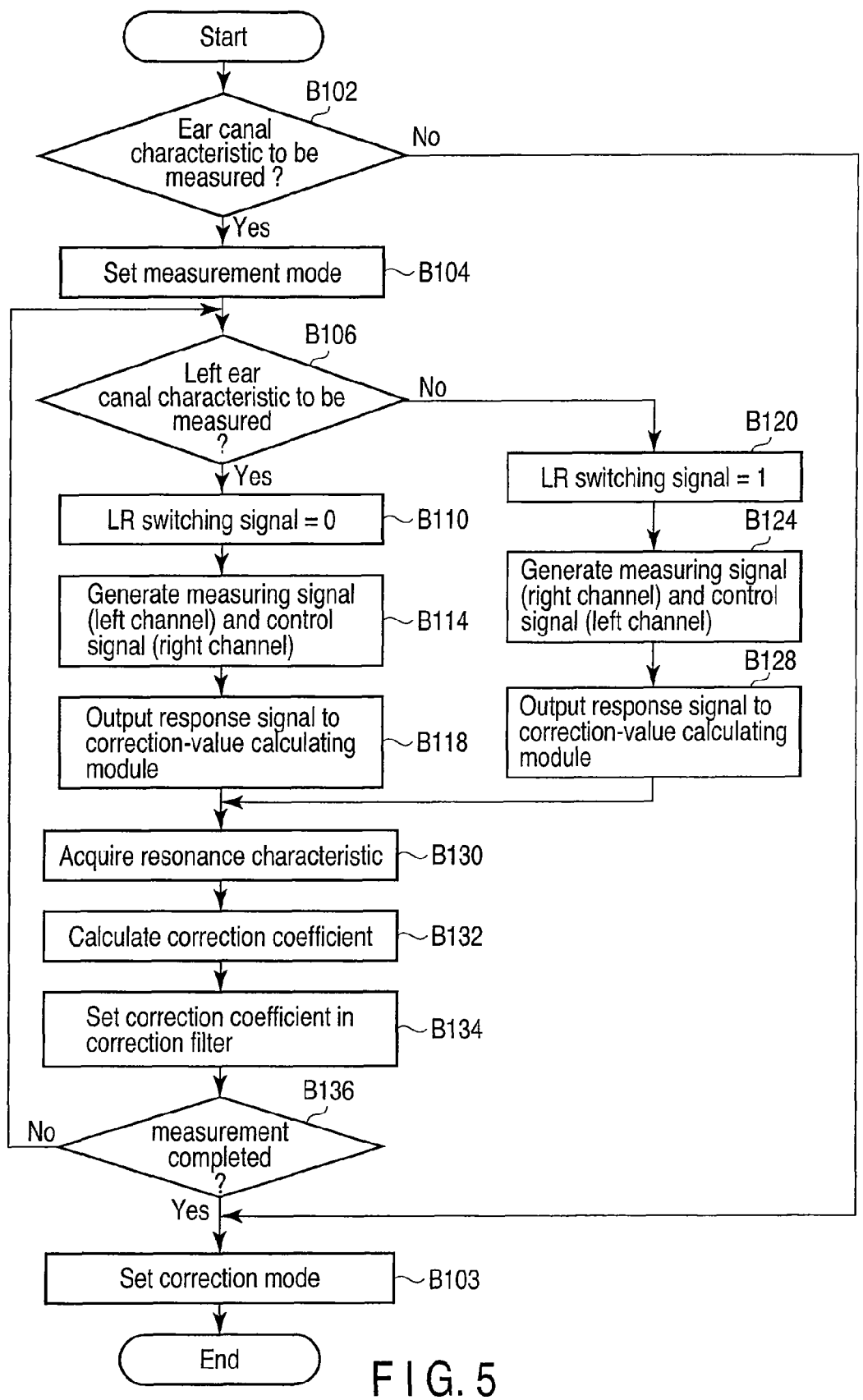
FIG. 5 is an exemplary flowchart explaining how a controller 46 in the acoustic characteristic correcting module 40 according to the embodiment of the invention.

FIG. 5 is a flowchart explaining the operation of the controller 46.

The characteristics of both ear canals may be measured and corrected when the listener uses the earphone 20R and 20L for the first time, or every time the listener uses the earphone 20R and 20L. Alternatively, they may be measured in accordance with the instruction of the listener 60. Further, when the characteristics of the ear canals should be measured and corrected may be preset.

When the measurement of the characteristics of the ear canals is started, the controller 46 determines whether the characteristics measured need to be corrected (Block B102).

If the correction filter 72 has already been adapted to the ear canal characteristics of the listener 60, the ear canal characteristics need not be measured or corrected (No in Block B102). In this case, the controller 46 supplies a mode switching signal of a low level (=0) to the switching module 44. The switching module 44 is thereby set to the correction mode (Block B103). Then, the process is terminated.

To measure and correct the ear canal characteristics (Yes in Block B102), the controller 46 supplies a mode switching signal of a high level (=1) to the switching module 44 (Block B104).

Then, the controller 46 determines whether the resonance characteristic of the left ear canal 62L should be measured (Block B106). Whether the characteristic of the left ear canal and that of the right ear canal should be first measured and corrected continuously or independently can be set beforehand. Whether which characteristic, that of the left ear canal or that of the right ear canal should be first measured and corrected can be set beforehand, too. Alternatively, these items may be set by the listener 60 at this point. In accordance with any item set, the controller 46 makes the decision in Block B106.

If the controller 46 determines that the resonance characteristic of the left ear canal 62L should be measured (Yes in Block B106), it supplies an LR switching signal of a low level (=0) to the switching module 44 so that the characteristic of the left ear may be measured (Block B110).

Once the mode of measuring the left ear characteristic has been set, the measuring-signal generating module 74 generates a short-pulse measuring signal for the left channel and a function-switching control signal for the left channel, under the control of the controller 46 (Block B114). As shown in FIG. 4, the measuring-signal generating module 74 generates a control signal of a high level in the right channel, setting the left channel to the first state. The measuring-signal generating module 74 then generates a measuring signal for the left channel and a control signal of a low level in the right channel, thereby setting the left channel to the second state. These signals are output via the acoustic signal controlling module 42 to the input/output terminals 121 and 122 of the switching module 44.

When a signal of a high level (=1) is input to the input/output terminal 122 of the right channel, the input/output terminal 121 of the left channel is connected to the left channel of the switching module 44 in the switching module 44. That is, the earphone 20L is set to the first state and starts functioning as an earphone.

In this condition, the measuring signal generated by the measuring-signal generating module 74 is output to the left channel of the switching module 44. The earphone 20L converts the measuring signal to an acoustic signal, which is output to the left ear canal 62L.

When the right-channel signal input to the input/output terminal 122 changes to a low level (=0), the left channel is set to the second state. In the switching module 44, the input/output terminal 120 is connected to the left channel of the earphone terminal 103. The function of the earphone 20L is switched to the microphone function. The earphone 20L thus converts the measuring signal (response signal) reflected by the left eardrum 64L of the listener 60 to an electric signal. The electric signal is input to the switching module 44.

The response signal is output from the input/output terminal 120 via the acoustic signal controlling module 42 to the correction-value calculating module 80 (Block B118).

On the other hand, to measure the characteristic of the right ear canal 62R (No in Block B106), the controller 46 supplies an LR switching signal of a high level (=1) to the switching module 44, setting the measurement of the right ear characteristic (Block B120).

When the measurement of the right ear characteristic is set, the measuring-signal generating module 74 generates a short-pulse measuring signal for the right channel and a function-switching control signal for the left channel, under the control of the controller 46 (Block B124). As shown in FIG. 4, the measuring-signal generating module 74 generates a control signal of a high level in the left channel, setting the right channel to the first state. The measuring-signal generating module 74 then generates a measuring signal for the right channel and a control signal of a low level in the left channel, thereby setting the left channel to the second state. These signals are output via the acoustic signal controlling module 42 to the input/output terminals 121 and 122 of the switching module 44.

When a signal of a high level (=1) is input to the input/output terminal 121 of the left channel, the input/output terminal 122 of the right channel is connected to the right channel of the earphone terminal 103 in the switching module 44. That is, the earphone 20R is set to the first state and starts functioning as earphone.

In this condition, the measuring signal generated by the measuring-signal generating module 74 is output to the right channel of the switching module 44. The earphone 20R converts this measuring signal to an acoustic signal, which is output to the right ear canal 62R.

When the left-channel signal input to the input/output terminal 121 changes to a low level (=0), the right channel is set to the second state. In the switching module 44, the input/output terminal 120 is connected to the right channel of the earphone terminal 103. The function of the earphone 20R is switched to the microphone function. The earphone 20R thus converts the measuring signal (response signal) reflected by the right eardrum 64R of the listener 60 to an electric signal. The electric signal is input to the switching module 44.

The response signal is output from the input/output terminal 120 via the acoustic signal controlling module 42 to the correction-value calculating module 80 (Block B128).

When the response signal from the right or left ear canal is input to the correction-value calculating module 80, the characteristic acquiring module 82 acquires the resonance characteristic of the ear canal from the response signal (Block B130). The correction coefficient calculating module 84 first converts the ear canal resonance characteristic acquired, from a time domain to a frequency domain, then detects the peak of resonance on the frequency axis, and finally calculates a coefficient of the correction filter 72 to form a dip at the peak frequency in order to cancel the peak (Block B132). The correction coefficient calculated is set in the correction filter 72 (Block B134).

Thereafter, the controller 46 determines whether all resonance characteristics required have been measured or not (Block B136). For example, the resonance characteristics of both ears may not be measured several times, though they should be so measured, or the resonance characteristic of only one ear is measured, though those of both ears should be continuously measured. In this case, the decision will be "No." If No is decided in Block B136, the process returns to Block B103. In Block B103, the measurement is repeated as required.

When measurement of the resonance characteristics is completed (that is, Yes in Block B136), the controller 46 supplies a mode switching signal of a low level (=0) to the switching module 44, setting the switching module 44 to the correction mode (Block B103). The process is then terminated.

In the correction mode, the sound source signal input to the correcting module 70 is corrected by the correction filter 72. The correction filter 72 decreases the resonance frequency gain of the sound source signal in accordance with the measurement result, thereby correcting the frequency characteristic. The sound source signal that has undergone the filtering process of the correction filter 72 is supplied to the switching module 44. At this point, both the left channel and the right channel are set to the first state (i.e., earphone function). Hence, the sound source signal now corrected in resonance characteristic is applied to the right ear canal 62R and the left ear canal 62L via the earphones 62R and 62L, respectively.

In the present embodiment, a filter is thus provided, which performs filtering on the left sound source signal and the right sound source signal, cancelling the resonance peaks actually measured in the ear canal of each listener. This prevents the listener from hearing unnatural sound even if resonance occurs in the ear canal. In addition, the earphones are neither large nor complex in structure, because they incorporate no microphones.

In the acoustic characteristic correcting apparatus described above, the level of the mode switching signal is changed before the switching signal is supplied from the controller 46 to the switching module 44, thereby switching the operating mode, between the measurement mode and the correction mode. The timing of switching the measurement for the left channel or the right channel can be controlled using a software control signal, because this timing need not be so strict.

On the other hand, the earphone function (first state) and the microphone function (second state) should be switched, from one to the other, at a more strict timing. Therefore, these functions are switched, one to the other, by utilizing the synchronization between the left channel and the right channel.

The above description has been made for the earphone having two channels, i.e., left channel and right channel. This invention may be applied to earphones having three or more channels, nevertheless. In this case, one channel is used for the measuring signal, while any one of the other channels is used for the control signal that switches the channel for the measuring signal between the first state (earphone function) and the second state (microphone function), as has been described above. Alternatively, some channels may be used for measuring signals, while any one of the other channels may be used for the control signal that switches the channel for the measuring signal between the first state (earphone function) and the second state (microphone function), so that measurement can be achieved for a plurality of channels at the same time. As a further alternative, even if three or more channels are available and two or more channels of these are associated with one ear, the other channels can be used for the control signal.

As described above, the controller 46 uses the signal output from the measuring-signal generating module 74, changing over the control signal in order to switch the first state to the second state, or vice versa. Instead, the left-channel sound source signal and the right-channel sound source signal, both output from the correcting module 70, may be used to switch the first state to the second state, or vice versa.

Figure 6:
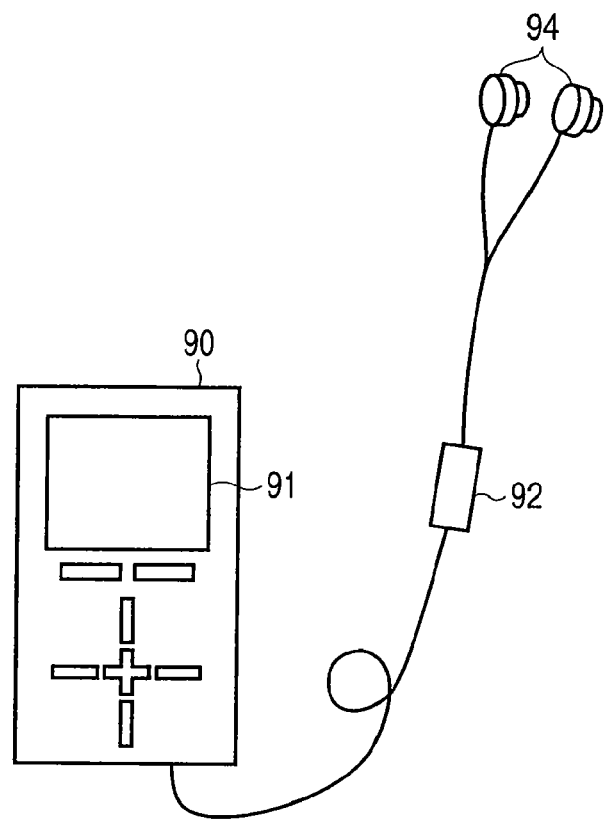
FIG. 6 is an exemplary diagram showing an exemplary use of the acoustic characteristic correcting module 40 according to the embodiment of the invention.

FIG. 6 shows an exemplary use of the acoustic characteristic correcting module 40. The acoustic characteristic correcting module 40 may be incorporated in an audio player 90. In this case, the module 40 may be incorporated not in the main unit of the player 90, but in a remote controller 92 or an earphone 94. Further, the module 40 need not be incorporated, in its entirety, in the audio player 90. Rather, only the correction filter 72 may be incorporated in the audio player 90. That is, the audio player 90 may use the correction filter 72 to correct sound source signals read from a flash memory, a hard disk or the like (not shown), whereas a PC, for example, may generate measuring signals, measure the resonance characteristics and calculate a correction coefficient.

Figure 7:
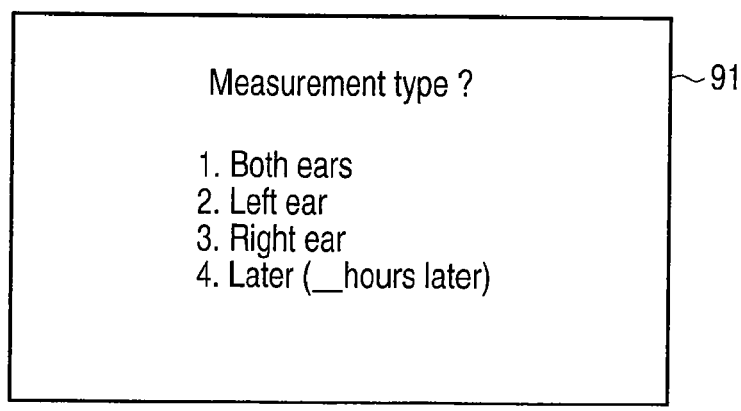
FIG. 7 is an exemplary diagram showing an exemplary operation menu displayed on a display screen, prompting the listener to determine whether resonance characteristics should be measured.

FIG. 7 shows an exemplary operation menu displayed on the screen of the display 91 of the audio player 90, prompting the listener to determine whether resonance characteristics should be measured. The menu may be displayed every time the earphone 94 is connected to the audio player 90. Alternatively, the menu may be displayed at regular intervals, for example every week or every month.

The menu shown in FIG. 7 presents various choices. The listener may select one option to measure the characteristics of both ears, another option to measure the characteristic of one ear only, or a further option to start measuring the characteristic upon the lapse of the time the listener has designated. The menu may not be displayed by the display 91 of the audio player 90, but by a display on the remote controller 92. If the audio player 90 is connected to a PC, the menu may be displayed on the display of the CP.

As has been described, in this embodiment, the measuring signal is supplied via the switching module 44 to the earphone 20L or 20R, the response signal reflected by the eardrum 64L or 64R is converted to an electric signal by the earphone 20L or 20R, and the electric signal is supplied via the switching module 44 to the correction-value calculating module 80. The left and right channels are set to the first state in order to output a measuring signal, and set to the second state in order to receive a response signal. The control signal that controls the switching of the state, between the first state and the second state, is transmitted using the channel that is not related to the transmission of the measuring signal. Since the left channel and the right channel are synchronized with each other, the switch timing is sufficiently accurate. Hence, a simple configuration can control the output of signals and the acquisition of the response signal, at a timing more accurate than otherwise.

Moreover, the resonance frequency of the ear canal 62L or 62R is acquired on the basis of the response signal received. Such a correction coefficient as will cancel this resonance frequency is calculated for the correction filter 72 and set in the correction filter 72. The resonance in the ear canal of the listener can therefore be cancelled with a simple configuration, without a microphone arranged near the earphones. Further, the characteristics of the resonance in the earphones and at the eardrums are acquired first for the listener and a correction filter fit for the characteristics is then formed. The resonance characteristics of the ear canal can therefore be cancelled, which differ in accordance with the ear canal characteristics inherent to the listener and the state in which the earphones are inserted in the ear canal. Since the characteristics of both the left ear and the right ear are acquired and a correction filter fit for these characters is formed, the resonance characteristic of the left ear and those of the right ear, which differ from each other, can be cancelled.

The above description is based on the assumption that two microphones are provided in the left and right earphones, respectively, and acquire the characteristic of the left ear and that of the right ear, respectively. Nonetheless, the characteristic of one ear only may be acquired, and the sound source signals from both ears may be filtered with a correction filter designed on the basis of the characteristic of one ear.

The resonance characteristic of either ear may change in accordance with the position of the earphone inserted in the ear canal. In view of this, the acoustic characteristic correcting module 40 may measure and correct the acoustic characteristics, for example every time the audio player 90 is activated or every time the user instructs. Alternatively, the acoustic characteristics may be measured and corrected when the module 40 is activated upon the lapse of a time the user has set.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The various modules of the systems described herein can be implemented as software applications, hardware and/or software modules, or components on one or more computers, such as servers. While the various modules are illustrated separately, they may share some or all of the same underlying logic or code. The accompanying claims and their equivalents are intended to cover such forms or modifications as would fall within the scope and spirit of the inventions.

What is claimed is:

1. An acoustic apparatus comprising:
a signal generation module configured to generate a measuring electric signal for measuring an acoustic characteristic of one of a right ear canal and a left ear canal and to generate a sound source electric signal for the other of the right ear canal and the left ear canal after a predetermined period of time;
a transducer module comprising first and second electro-acoustic transducers that are attached to the right ear canal and the left ear canal and having a first operation mode of converting an electric signal to an acoustic signal and a second operation mode of converting an acoustic signal to an electric signal; and
a switch module connected between the signal generation module and the transducer module, configured to set the one of the first and the second electro-acoustic transducers, attached to the one of the right ear canal and the left ear canal, to the first operation mode, to supply the measuring electric signal to the one of the first and the second electro-acoustic transducers, and to switch the operation mode of the one of the first and the second electro-acoustic transducers to the second operation mode in accordance with a change in level of the sound source electric signal, wherein
the one of the first and the second electro-acoustic transducers is configured to convert the measuring electric signal to a measuring acoustic signal in order to output the measuring acoustic signal to the one of the right ear canal and the left ear canal and to convert a response acoustic signal, which is supplied from the one of the right ear canal and the left ear canal and responds to the measuring acoustic signal, to a response electric signal.

2. The apparatus of claim 1, further comprising a characteristic acquisition module configured to acquire an acoustic characteristic of the one of the right ear canal and the left ear canal from the response electric signal.

3. The apparatus of claim 1, wherein the first and the second electro-acoustic transducers comprise an earphone or a headphone.

4. The apparatus of claim 1, wherein the switch module is configured to switch the operation mode of the one of the first and the second electro-acoustic transducers to the second operation mode, and then to fix the operation modes of the first and the second electro-acoustic transducers to the first mode.

5. The apparatus of claim 1, wherein the switch module comprises a function of preventing the sound source electric signal for the other of the right ear canal and the left ear canal from being supplied to the one of the first and the second electro-acoustic transducers attached to the right ear canal and the left ear canal.

6. A method of controlling an acoustic apparatus comprising a signal generation module configured to generate a measuring electric signal for measuring an acoustic characteristic of one of a right ear canal and a left ear canal and to generate a sound source electric signal for the other of the right ear canal and the left ear canal after a predetermined period of time; and a transducer module comprising first and second electro-acoustic transducers that are attached to the right ear canal and the left ear canal and having a first operation mode of converting an electric signal to an acoustic signal and a second operation mode of converting an acoustic signal to an electric signal, the method comprising:
 setting the one of the first and the second electro-acoustic transducers, attached to the one of the right ear canal and the left ear canal, to the first operation mode;
 supplying the measuring electric signal to the one of the first and the second electro-acoustic transducers;
 switching the operation mode of the one of the first and the second electro-acoustic transducers to the second operation mode in accordance with a change in level of the sound source electric signal, wherein the one of the first and the second electro-acoustic transducers is configured to convert the measuring electric signal to a measuring acoustic signal in order to output the measuring acoustic signal to the one of the right ear canal and the left ear canal and to convert a response acoustic signal, which is supplied from the one of the right ear canal and the left ear canal and responds to the measuring acoustic signal, to a response electric signal.

7. The method of claim 6, further comprising acquiring an acoustic characteristic of the one of the right ear canal and the left ear canal from the response electric signal.

8. The method of claim 6, further comprising switching the operation mode of the one of the first and the second electro-acoustic transducers to the second operation mode, and then fixing the operation modes of the first and the second electro-acoustic transducers to the first mode.

9. The method of claim 6, further comprising preventing the sound source electric signal for the other of the right ear canal and the left ear canal from being supplied to the one of the first and the second electro-acoustic transducers attached to the right ear canal and the left ear canal.

\* \* \* \* \*